United States Patent [19]

Nishida et al.

[11] Patent Number: 4,703,257
[45] Date of Patent: Oct. 27, 1987

[54] LOGIC CIRCUIT HAVING A TEST DATA SCAN CIRCUIT

[75] Inventors: Takao Nishida, Kokubunji; Toru Hiyama, Atsugi; Kaoru Moriwaki; Shun Ishiyama, both of Hadano; Shunsuke Miyamoto, Tokyo, all of Japan

[73] Assignee: Hitachi, Ltd., Tokyo, Japan

[21] Appl. No.: 810,296

[22] Filed: Dec. 18, 1985

[30] Foreign Application Priority Data

Dec. 24, 1984 [JP] Japan .................................. 59-270877

[51] Int. Cl.$^4$ ............................................ G01R 31/28
[52] U.S. Cl. ................................ 324/73 R; 324/158 R
[58] Field of Search .......................... 324/73 R, 158 R; 371/25, 15

[56] References Cited

U.S. PATENT DOCUMENTS 4,553,236 11/1985 Zario et al. ........................ 371/25 X

OTHER PUBLICATIONS

"Testing of LSI Logic Circuits Containing Imbedded Shift Arrays"; IBM Technical Disclosure; vol. 20, No. 10; Mar. 1978; pp. 4021-4022.

Primary Examiner—Ernest F. Karlsen
Assistant Examiner—Vinh P. Nguyen
Attorney, Agent, or Firm—Antonelli, Terry & Wands

[57] ABSTRACT

A logic circuit having a diagnostic function is disclosed in which each of first latches for applying data to combinational circuits included in the logic circuit and/or receiving data from the combinational circuits is provided with a second latch and a selector for selecting the output of the first latch in a first mode and for selecting the output of the second latch in a second mode. In a regular operation, the output of the first latch is never transferred through the second latch, and the selector is operated in the first mode. Accordingly, the output of the first latch is supplied directly to a succeeding combinational circuit, and thus the delay caused by the second latch in the prior art can be eliminated. Although the delay caused by the selector is unavoidable, this delay can be made far smaller than the delay caused by the second latch. In a diagnostic operation, the output of the first latch is transferred through the second latch, and the selector is operated in the second mode, in order to perform the diagnostic operation stably even when data is transferred between first latches having the same phase, or the logic circuit includes a one-latch loop.

4 Claims, 11 Drawing Figures

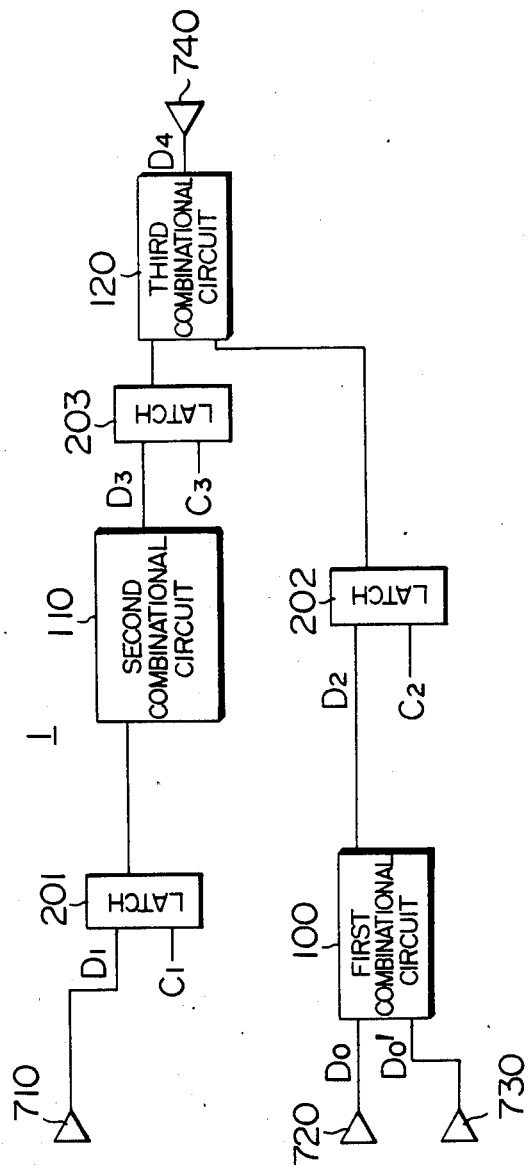
F I G. 1

LOGIC CIRCUIT HAVING A TEST DATA SCAN CIRCUIT

BACKGROUND OF THE INVENTION

The present invention relates to a logic circuit provided with a scan circuit for facilitating a diagnosis of the logic circuit.

In order to improve the testability of a large-scale logic circuit, a method has been used in which a scan path is added to a large-scale complicated sequential circuit, and the sequential circuit is divided into a plurality of small-scale combinational circuits each connected between latches. This method will be explained below, by reference to the drawings.

FIG. 1 shows an example of a sequential circuit which is to be tested. A sequential circuit can be divided into a plurality of partial circuits each including no latch (that is, combinational circuits) and a plurality of latches. In FIG. 1, reference numerals 100, 110 and 120 designate combinational circuits, 201 to 203 latches, 710, 720 and 730 system input terminals for applying input data to a sequential circuit 1, and 740 a system output terminal for delivering output data from the sequential circuit 1. When system clock signals $C_i$ (where i=1, 2 and 3) are put to an ON state, the latches 201 to 203 take in and hold system data $D_i$ (where i=1, 2 and 3) inputted thereto. The combinational circuits 100, 110 and 120 are applied with system data from the input terminals 720 and 730, system data from the latch 201, and system data from the latches 202 and 203, respectively, and deliver system data corresponding to input system data to the latch 202, the latch 203, and the system output terminal 740, respectively. In more detail, the first combinational circuit 100 receives data $D_0$ and $D_0'$ from the input terminals 720 and 730, the second combinational circuit 110 receives the output data $D_1$ of the latch 201, and the third combinational circuit 120 receives the output data $D_2$ and $D_3$ from the latches 202 and 203. In the sequential circuit 1, the result $D_i$ (where i=2 or 3) of logical operation performed by each combinational circuit 100 or 110 is stored in the latch on the output side of the combinational circuit in response to the clock signal $C_i$ (where i=2 or 3), and then sent to a succeeding conbinational circuit. Thus, a predetermined output signal $D_4$ corresponding to the input signals applied to the system input terminals 710, 720 and 730 is obtained at the system output terminal 740. Even when the sequential circuit 1 includes a feedback loop, the circuit 1 can operate in a manner similar to that described above. As the number of logic gates existing between the system input terminals 710, 720 and 730 and the system output terminal 740 is larger, it becomes difficult to detect a fault in the sequential circuit 1.

In order to solve the above problem, a scan-path method has been widely used. In this method, an access path for easily observing and controlling a latch, is additionally connected to each of latches included in a sequential circuit. By doing so, each latch can be treated as a system input terminal or system output terminal, and thus the whole of the sequential circuit can be divided into a plurality of combinational circuits. Accordingly, it becomes very easy to test the sequential circuit. Two typical examples of the scan-path method have been known, one of which is a shift-scan method described in an article entitled "A Logic Design Structure for LSI Testing " (DA Conference, 1977, pages 462 to 468), and the other is a random-scan method described in an article entitled "Testing VLSI with Random Access Scan" (COMPCON, 1980, pages 50 to 52).

FIG. 2 shows an example of a circuit configuration for performing the shift-scan method. Referring to FIG. 2, latches 211 to 213 each having a scan function are used in place of the latches 201 to 203 of FIG. 1. Each of the latches 211 to 213 is made up of an L1-latch 211A, 212A or 213A and an L2-latch 211B, 212B or 213B. Like the latches 201 to 203 of FIG. 1, each of the L1-latches 211A, 212A and 213A takes in and holds system data $D_1$, $D_2$ or $D_3$ when the system clock signal $C_1$, $C_2$ or $C_3$ is put to the ON-state. Further, when a shift clock signal A is put to an ON-state, the L1-latches 211A, 212A and 213A take in and hold an input 270-1 from a scan-in pin SI, an output 270-2 from the L2-latch 211B, and an output 270-3 from the L2-latch 212B, respectively. The L2-latches 211B, 212B and 213B are provided for stabilizing a shift operation which will be explained below. When a shift clock signal B is put to an ON-state, the L2-latches 211B, 212B and 213B take in and hold the outputs of the L1-latches 211A, 212A and 213A, respectively. Accordingly, the L1-latches 211A, 212A and 213A and the L2-latches 211B, 212B and 213B are connected so as to form a shift string between the scan-in pin SI and a scan-out pin SO. In a diagnosis mode, by applying shift clock pulses A and B alternately, a desired value from the scan-in pin SI can be set in the latches 211, 212 and 213, and the contents of these latches can be observed at the scan-out pin SO. In a regular mode, by keeping the clock signals A and B at an OFF-state throughout the operation, the circuit of FIG. 2 can perform entirely the same operation as the circuit of FIG. 1. That is, the L1-latches 211A, 212A and 213A correspond to the latches 201 to 203 of FIG. 1, and the L2-latches 211B, 212B and 213B act as insulating elements.

FIG. 3 shows an example of a circuit configuration for performing the random-scan method. Referring to FIG. 3, latches 221 to 223 each having a scanning function are substituted for the latches 201 to 203 of FIG. 1, and are assigned respective addresses. Like the latches 201 to 203, each of the latches 221 to 223 takes in and holds system data $D_i$ (where i=1, 2 or 3) when the system clock signal $C_i$ (where i=1, 2 or 3) is put to the ON-state. Additionally, each of the latches 221 to 223 can take in and hold a value 280 from the scan-in pin SI, when the latch is selected and the scan clock signal A is put to the ON-state. Further, when each of the latches 221 to 223 is selected, the contents of the selected latch can be observed at the scan-out pin SO. An address pin AD and an address decoder 300 are additionally provided to select a desired one of the latches 221 to 223. Selection signals 302-1, 302-2 and 302-3 which are produced by decoding addresses by the address decoder 300, are sent to the latches 221, 222 and 223, respectively. Each selection signal 302-$i$ (where i=1, 2 or 3) is ANDed with the scan clock signal A to form a clock signal for diagnosis, and is also ANDed with the output of a corresponding latch 221, 222 or 223 to form a scan-out signal. The scan-out signals from all the latches 221 to 223 are ORed by a gate 330, the output of which can be observed at the scan-out pin SO. In a diagnosis mode, a value from the scan-in pin SI can be set in a desired one of the latches 221 to 223 by applying the address of the desired latch to the address decoder 300 through the address pin AD and by applying the scan clock pulse A, and the contents of a desired latch 221, 222 or 223 can be observed at the scan-out pin SO by applying the address of this latch to the address decoder 300 without applying the scan clock pulse A. In a regular mode, by keeping the scan clock signal A at the OFF-state through the operation, the circuit of FIG. 3 can perform entirely the same operation as the circuit of FIG. 1.

As can be seen from FIGS. 2 and 3, in a sequential circuit having a scan path, each of combinational circuits which are obtained by dividing the sequential circuit in the above-mentioned manner, can be tested in the following manner.

(1) A test pattern is set in (or scanned in) a latch which is connected to the input side of a desired combinational circuit.

(2) A system clock signal for a latch which is connected to the output side of the combinational circuit, is applied to latch system data by the latch on the output side. This is called the clock advance.

(3) The system data stored in the latch on the output side is read out (or scanned out) and compared with an expected value.

The above processing is repeated for all test patterns and for all combinational circuits. In order to accurately carry out the above testing operation, several restrictions are usually placed on the logical design of a sequential circuit. One of the restrictions is to forbid the transfer of data between latches having the same phase. That is, the system clock signal for the latch on the output side is inhibited from being in phase with the system clock for the latch on the input side. For example, the system clock signal $C_1$ applied to the L1-latch 211A of FIG. 2 and the system clock signal $C_3$ applied to the L1-latch 213A are inhibited from being in phase. Further, referring to FIG. 3, the system clock signal $C_1$ for the latch 221 is inhibited from being in phase with the system clock signal $C_3$ for the latch 223. This is because a value previously set in the latch on the input side may vary in a clock advance period and thus there is a danger of the latch on the output side taking in a new value, that is, a stable operation is not always performed. The above phenomenon is based upon the fact that the width of the system clock pulse used in a diagnostic operation is larger than the width of the system clock pulse used in a regular operation, and exceeds a minimum delay time caused by a combinational circuit connected between latches having the same phase. In other words, in a case where the width of the system clock pulse is shorter than the above minimum delay time, the system clock pulse is extinguished in a time necessary for the new value of the latch on the input side to reach the latch on the output side, and thus the latch on the output side can take in the value which is previously set in the latch on the input side, without being affected by the new value. While, in a case where the width of the system clock pulse is longer than the minimum delay time, the system clock pulse may exist even after the new value of the latch on the input side has reached the latch on the output side, and thus the value which is previously set in the latch on the input side, will be lost. Also, a one-latch loop in which the output of a latch is applied to the input thereof without passing through another latch, is inhibited from transmitting data for the same reason as in the case where data is transferred between latches having the same phase.

In one of conventional methods for eliminating the above restriction on the logical design, each of the latches 211 to 213 of FIG. 2 has a master-slave arrangement and each slave latch is controlled by a clock signal for diagnosis, as shown in FIG. 6 of an article written in Japanese (NIKKEI ELECTRONICS, No. 210, 1979, pages 57 to 79).

FIG. 4 shows an example of a circuit configuration for carrying out the above method. Referring to FIG. 4, the outputs of master latches (namely, L1-latches) 211A, 212A and 213A are not used as system data and the outputs 270-2, 270-3 and 270-4 of slave latches (namely, L2-latches) 211B, 212B and 213B are used as the system data $D_i$. Accordingly, in order to send the data of a preceding combinational circuit, for example, the data $D_3$ of the combinational circuit 110 to the succeeding combinational circuit 120, it is necessary to fetch the data $D_3$ of the combinational circuit 110 into the L1-latch 213A by advancing the system clock signal $C_3$ and to transfer the data $D_3$ from the L1-latch 213A to the L2-latch 213B by applying the shift clock signal B. The shift clock signal B is used in both a regular operation and a diagnostic operation. According to such a circuit configuration, even when the system clock signal $C_1$ for the latch 211 is in phase with the system clock signal $C_3$ for the latch 213, the above-mentioned problem does not arise. This is because, if the system clock signal $C_1$ is advanced simultaneously with the system clock signal $C_3$, the output of the L1-latch 211A may vary in accordance with a logical value at the system input terminal 710 but the output of the L2-latch 211B will be kept unchanged since the shift clock signal B is kept at the OFF-state, and thus the output of the second combinational circuit 110 will also be kept unchanged. In a sequential circuit having the master-slave arrangement, however, two kinds of clock signals $C_i$ and B are used for transmitting data in a regular operation. Accordingly, the sequential circuit has a disadvantage that the system delay in a regular operation increases and thus the operation speed of the circuit is degraded. For example, the path delay in the signal path which starts from the system data input terminal of the latch 211 and terminates at the system data input terminal of the latch 213, increases as compared with the circuit configuration of FIG. 2, by a delay time due to the L2-latch 211B of the latch 211.

In other words, a trade-off exists between the relaxation of restriction on logical design and the improvement of operation speed, and it is difficult for a conventional scan circuit to satisfy two requirements, that is, the relaxation of the above restriction and the improvement of operation speed.

SUMMARY OF THE INVENTION

In view of the drawback of the prior art, it is an object of the present invention to provide a logic circuit having a diagnostic function which can relax the above referenced restriction on the logical design for diagnosis and can improve the operation speed of the logic circuit, and to provide a method of making a diagnosis for the logic circuit.

In order to attain the above object, according to the present invention, there is provided a logic circuit having a diagnostic function, in which each of first latches for applying data to combinational circuits included in the logic circuit and/or receiving data from the combinational circuits is provided with a second latch and a selector for selecting the output of the first latch in a first mode and for selecting the output of the second latch in a second mode. In a regular operation, the output of the first latch is never transferred through the second latch, and the selector is operated in the first mode. Accordingly, the output of the first latch is supplied directly to a succeeding combinational circuit, and thus the delay caused by the second latch in the prior art is eliminated. Although the delay caused by the selector is unavoidable, this delay can be made for smaller than the delay caused by the second latch. In a diagnostic operation, the output of the first latch is transferred through the second latch, and the selector is operated in the second mode, in order to perform the diagnostic operation stably even when data is transferred between first latches having the same phase, or the logic circuit includes a one-latch loop.

BRIEF DESCRIPTION OF THE DRAWINGS

FIG. 1 is a block diagram showing an example of a sequential circuit which is to be subjected to a diagnosis.

DESCRIPTION OF THE PREFERRED EMBODIMENTS

Figure 2:
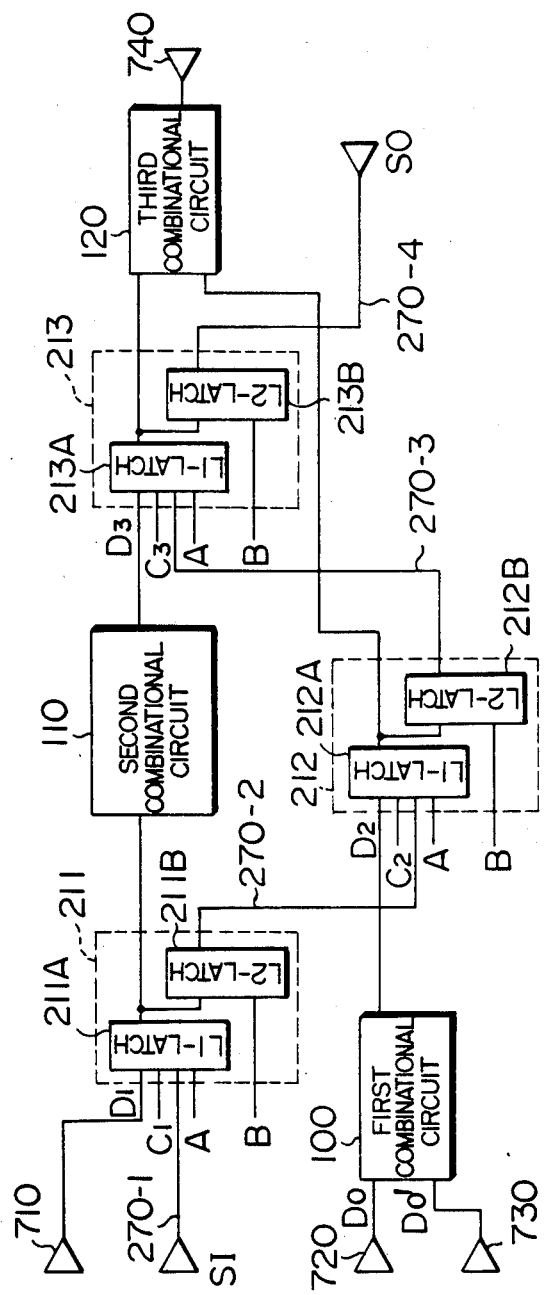
FIG. 2 is a block diagram showing a modified version of the sequential circuit of FIG. 1 which is additionally provided with a shift-scan circuit.

The present invention will be explained on the basis of embodiments depicted in the drawings.

Figure 4:
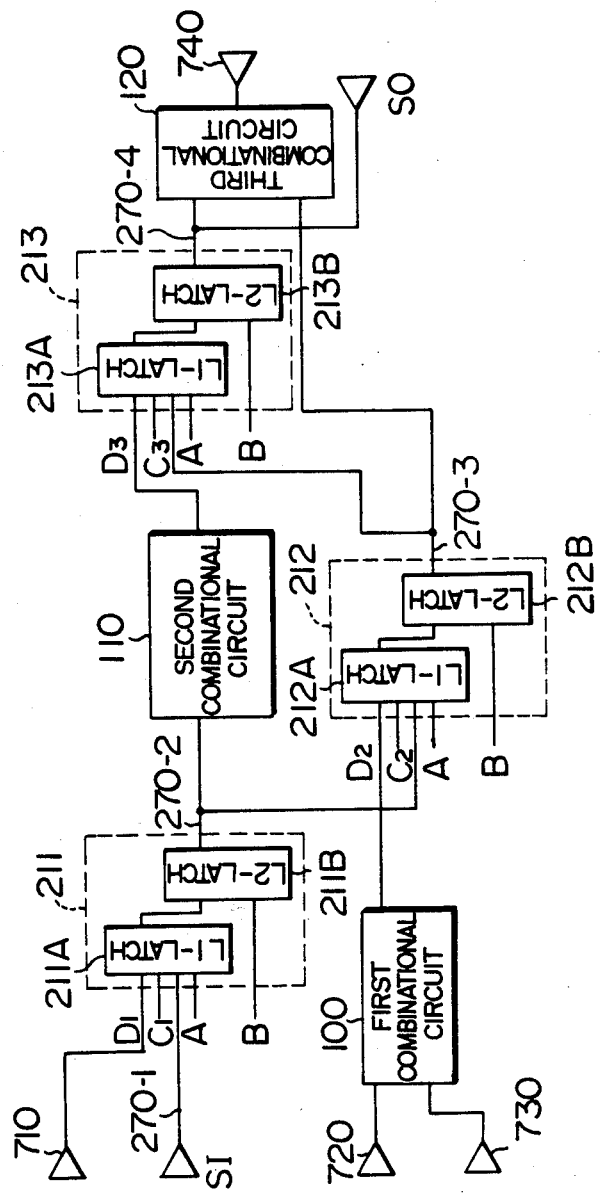
FIG. 4 is a block diagram showing a modified version of the circuit of FIG. 2 in which each latch has a master-slave arrangement.
Figure 5:
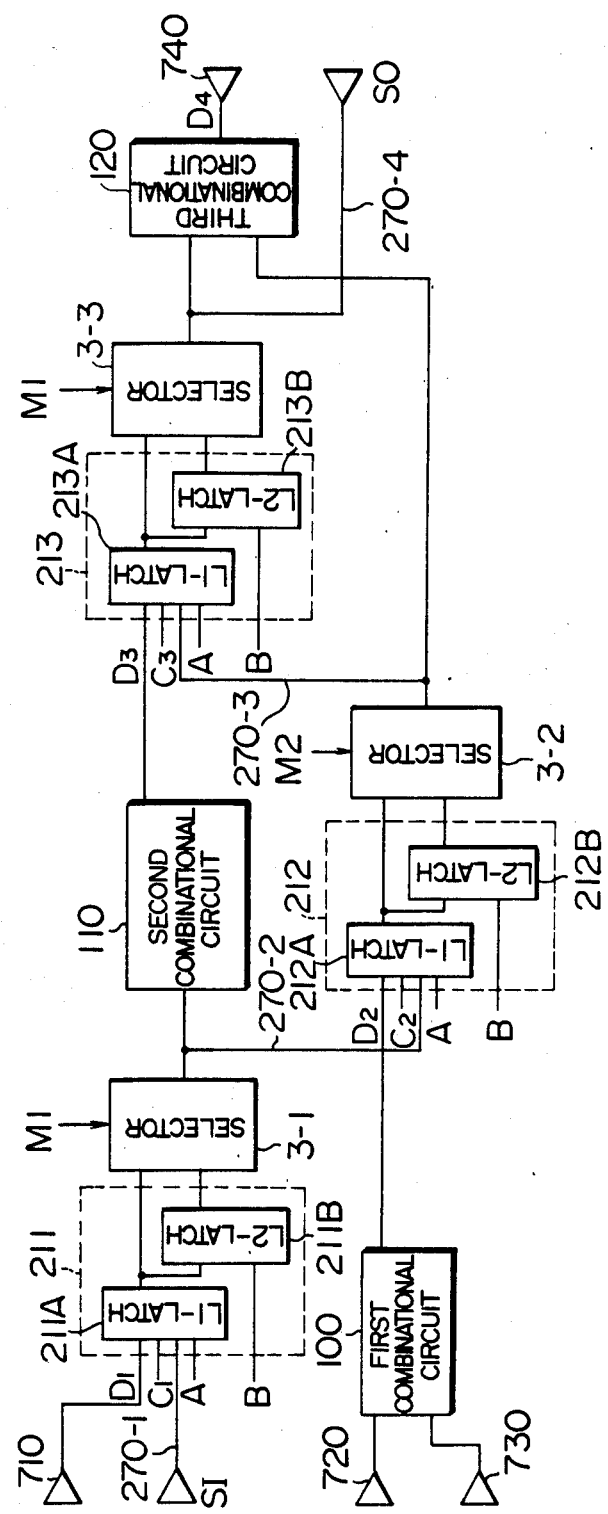
FIG. 5 is a block diagram showing an embodiment of a logic circuit according to the present invention which corresponds to the circuit of FIG. 2.

FIG. 5 shows an embodiment of a logic circuit according to the present invention. The present embodiment is different from the conventional circuits of FIGS. 2 and 4 in that the latches 211, 212 and 213 are provided with selectors 3-1, 3-2 and 3-3, respectively. In FIG. 5, the same reference numerals as in FIGS. 2 and 4 designate like parts. The selectors 3-1, 3-2 and 3-3 deliver the outputs of the L1-latches 211A, 212A and 213A or the outputs of the L2-latches 211B, 212B and 213B, depending upon whether mode control signals M1 and M2 take a level "1" or "0".

Figure 6:
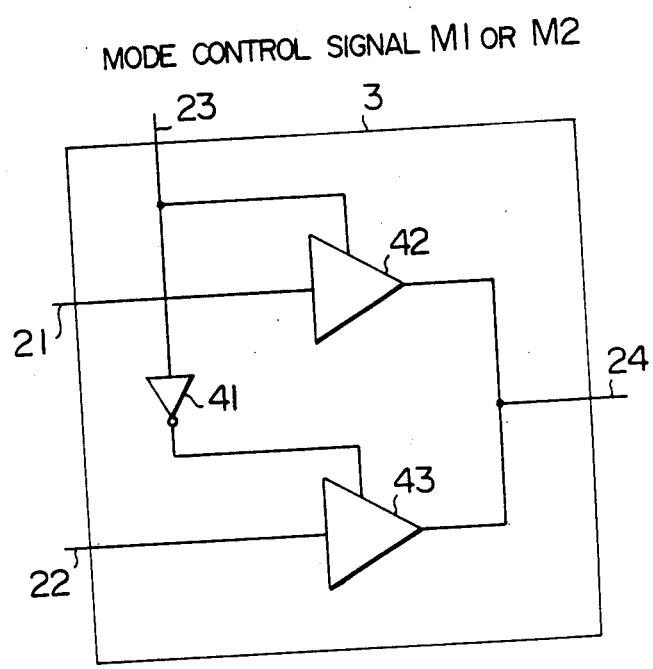
FIG. 6 is a circuit diagram showing an example of a selector used in a logic circuit according to the present invention.

FIG. 6 shows an example of the selectors 3-1, 3-2 and 3-3 which is made up of complementary MOS transistors. In FIG. 6, reference numeral 41 designates an inverter formed of a CMOS (namely, complementary MOS) transistor circuit, and 42 and 43 3-state elements each formed of a CMOS transistor circuit. When the mode control signal M1 or M2 applied to a terminal 23 takes the level "1", the output of the L1-latch connected to a terminal 21 is selectively delivered from an output terminal 24. When the mode control signal M1 or M2 takes the level "0", the output of the L2-latch connected to a terminal 22 is selectively delivered from the output terminal 24.

A slave latch requires 6 to 8 CMOS transistors, but selector requires only 2 to 4 transistors. it is generally possible to make the delay time of a signal path between the terminal 21 and the output terminal 24 shorter than a delay time through the slave latch.

Next, explanation will be made of both the regular operation and the diagnostic operation of the present embodiment, by reference to timing charts.

Figure 7:
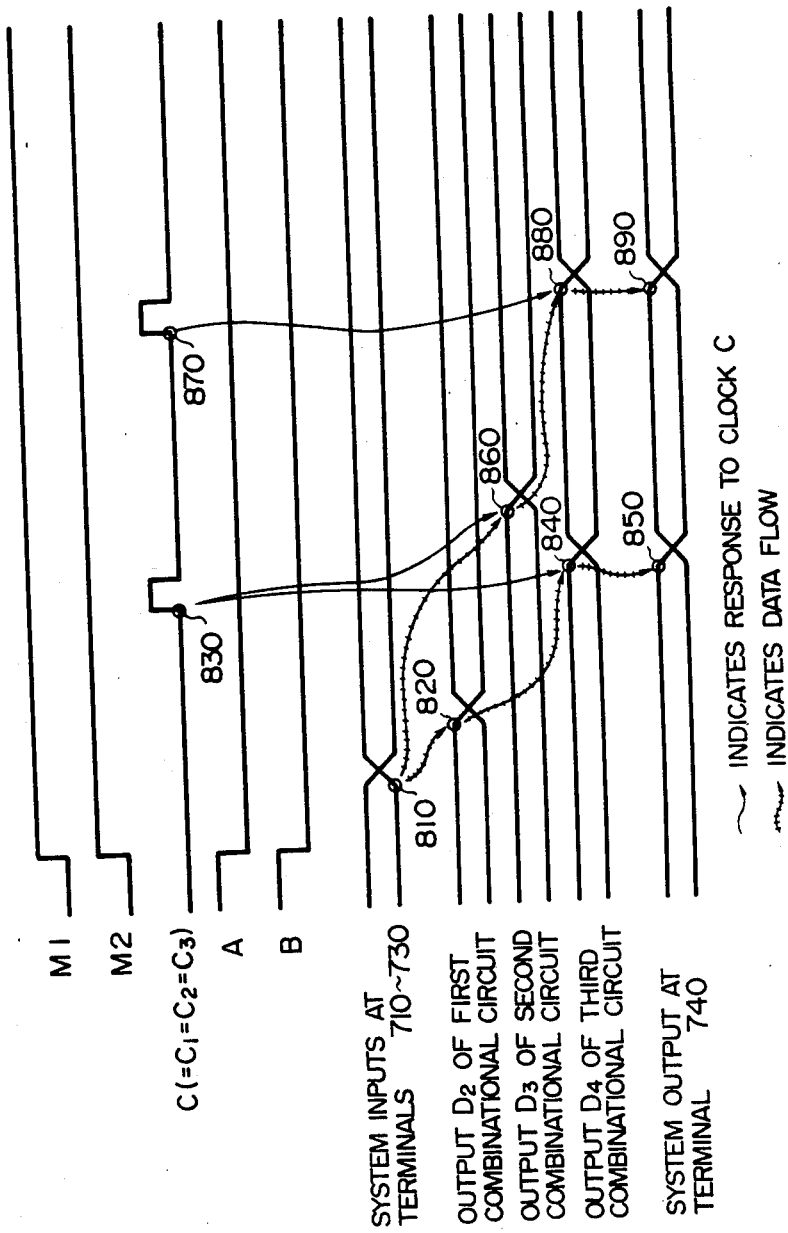
FIG. 7 is a timing chart for explaining the regular operation of the embodiment of FIG. 5.

FIG. 7 is a timing chart for explaining the regular operation of the embodiment of FIG. 5. Referring to FIG. 7, the mode control signals M1 and M2 are kept at the level "1" throughout the regular operation, and thus the outputs of the L1-latches 211A, 212A and 213A are selectively delivered from the selectors 3-1, 3-2 and 3-3, respectively. Accordingly, the present embodiment can perform the same regular operation as the circuit of FIG. 2. Further, the shift clock signals A and B are kept at the level "0" throughout the regular operation. Even when the system clock signals $C_1$, $C_2$ and $C_3$ are in phase, there arises no problem in the present embodiment, as will be explained later. Therefore, the same system clock signal C will be used as the signals $C_1$, $C_2$ and $C_3$. Referring to FIG. 7, suppose that the system input signals at the input terminals 710, 720 and 730 are varied at a time 810. The system output signal corresponding to the above variation in system input signals appears on the output terminal 740 at a time 890, by advancing the system clock signal C at a time 830 and at a time 870. In more detail, after the system input signals at the terminals 710, 720 and 730 have varied at a time 810, the output of the first combinational circuit 100 varies at a time 820. Next, the system clock signal C is advanced at a time 830. Immediately thereafter, the outputs of the L1-latches 211A, 212A and 213A are varied. Because of the variation in the output of the L1-latch 212A and the variation in the output of the L1-latch 213A, the output D of the third combinational circuit 120 is varied at a time 840. Thus, the system output at the output terminal 740 is varied at a time 850. Further, because of the variation in the output of the L1-latch 211A, the output of the second combinational circuit 110 is varied at a time 860. This variation is latched by the L1-latch 213A after the system clock signal C has been again advanced at a time 870, and the output $D_4$ of the third combinational circuit 120 is varied at a time 880. Thus, the final system response appears on the output terminal 740 at the time 890. In the regular operation, the pulse width of the system clock signal C is far smaller than a minimum delay time between the L1-latch 211A and the L1-latch 213A. Accordingly, even when the system clock signal applied to the L1-latch 211A is in phase with the system clock signal applied to the L1-latch 213A, there is no danger of the data of the L1-latch 211A reaching the L1-latch 213A in the duration time of the system clock signal. In other words, there is no danger of the output of the L1-latch 211A at the time 830 (namely, at the time when the system clock signal is advanced for the first time) being latched by the L1-latch 213 as it is. While, in the diagnostic operation, a tester for diagnosis generates a system clock signal having a large pulse width. Accordingly, when the system clock signal applied to the L1-latch 211A is in phase with the system clock signal applied to the L1-latch 213A, the data of the L1-latch 211A can reach the 213A in the duration time of the system clock signal, and hence there is a danger of the previously-mentioned problem arising. The present embodiment, however, can perform a stable diagnostic operation, as will be explained below.

Figure 8:
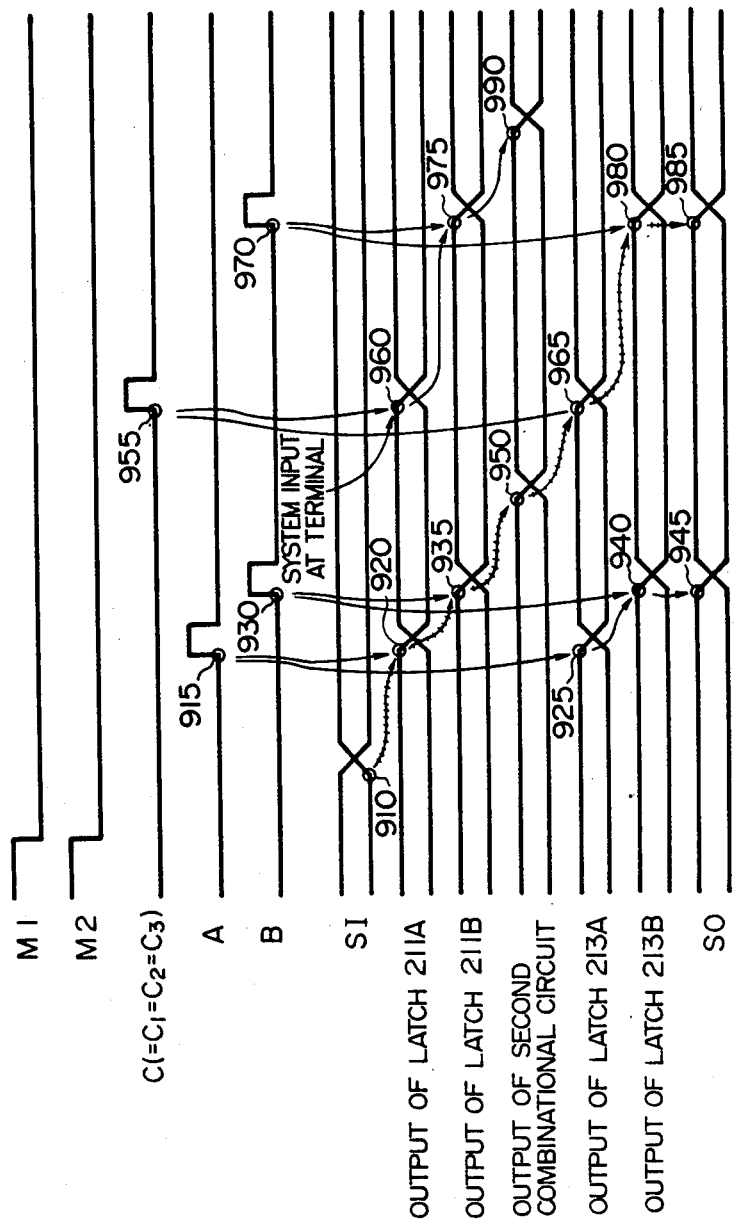
FIG. 8 is a timing chart for explaining the diagnostic operation of the embodiment of FIG. 5.

FIG. 8 is a timing chart for explaining a diagnostic operation for the second combinational circuit 110 of FIG. 5. Referring to FIG. 8, the mode control signals M1 and M2 are kept at the level "0" throughout the diagnostic operation, in order for the selectors 3-1, 3-2 and 3-3 to select the outputs of the L2-latches 211B, 212B and 213B. Thus, each of the latches 211, 212 and 213 takes the master-slave arrangement, and hence the embodiment of FIG. 5 can perform entirely the same diagnostic operation as the conventional circuit of FIG. 4. In FIG. 8, reference numerals 910, 915 and 930 designate a scan-in time, 955 a clock advance time, and 970 a scan-out time. Further, a data path 910-920-935-950-965-980-985 indicates the flow of signal in a process for observing the response to a signal which is applied to the scan-in pin SI, at the scan-out pin SO. In more detail, input data which is applied to the scan-in pin SI at the time 910, is latched by the L1-latch (namely, the master latch) 211A of the latch 211 at a time 920, by applying the shift clock signal A at the time 915. Thereafter, the shift clock signal B is applied at the time 930, and hence the L2-latch (namely, the slave latch) 211B of the latch 211 takes in the input data at a time 935. Thus, the setting of the input data into the second combinational circuit 110, that is, a data scan-in operation for the second combinational circuit 110 is completed. The output $D_3$ of the second combinational circuit corresponding to the input data is obtained at a time 950 (that is, when a predetermined period has elapsed after the time 935). Thereafter, the system clock signal C is generated at the time 955. Thus, the output data $D_3$ of the second combinational circuit 110 is latched by the L1-latch (namely, the master latch) 213A of the latch 213 at a time 965. Next, the shift clock signal B is again applied at the time 970, and thus the output data $D_3$ is latched by the L2-latch (namely, the slave latch) 213B of the latch 213 at a time 980. At a time 985, the data $D_3$ can be observed at the scan-out pin SO.

According to the circuit configuration of FIG. 5, even if the system clock signal applied to the latch 211 is in phase with the system clock signal applied to the latch 213, no problem will arise for the following reason. When, the system clock signal C is generated at the time 955, the contents of the L1-latch (namely, the master latch) 211A of the latch 211 may vary at a time 960. However, the shift clock signal B is kept at the OFF-state, and hence the contents of the L2-latch (namely, the slave latch) 211B of the latch 211 are kept unchanged. Accordingly, the output data $D_3$ of the second combinational circuit 110 is not varied. Thus, even when the system clock signal which is generated at the time 955, has a large pulse width, there is no danger of new output data of the L1-latch 211A entering in the second combinational circuit 110. When the shift clock signal B is generated at the time 970, the contents of the L2-latch (namely, the slave latch) 211B of the latch 211 are varied at a time 975, and thus the output data $D_3$ of the second combinational circuit 110 is varied at a time 990. At this time, however, the system clock signal C is kept at the OFF-state, and hence the contents of the L1-latch (namely, the master latch) 213A of the latch 213 are latched by the L2-latch (namely, the slave latch) 213B of the latch 213 without being destroyed by the new output of the second combinational circuit. As mentioned above, even if the system clock signals applied to the latches 211 and 213 are in phase, no problem will arise in a diagnostic operation.

The diagnostic operation for each of the first combinational circuit 100 and the third combinational circuit 120 can be performed in the same manner as that described above.

It is to be noted that, in the present embodiment, the mode control signal M1 is applied to respective selectors of odd-numbers latches of a shift string, for example, the selectors 3-1 and 3-3 of the latches 211 and 213, and the mode control signal M2 is applied to respective selectors of even-numbered latches, for example, the selector 3-2 of the latch 212. The reason for this is concerned with the 0-cycle test, and will be explained later, by reference to FIG. 10.

Figure 3:
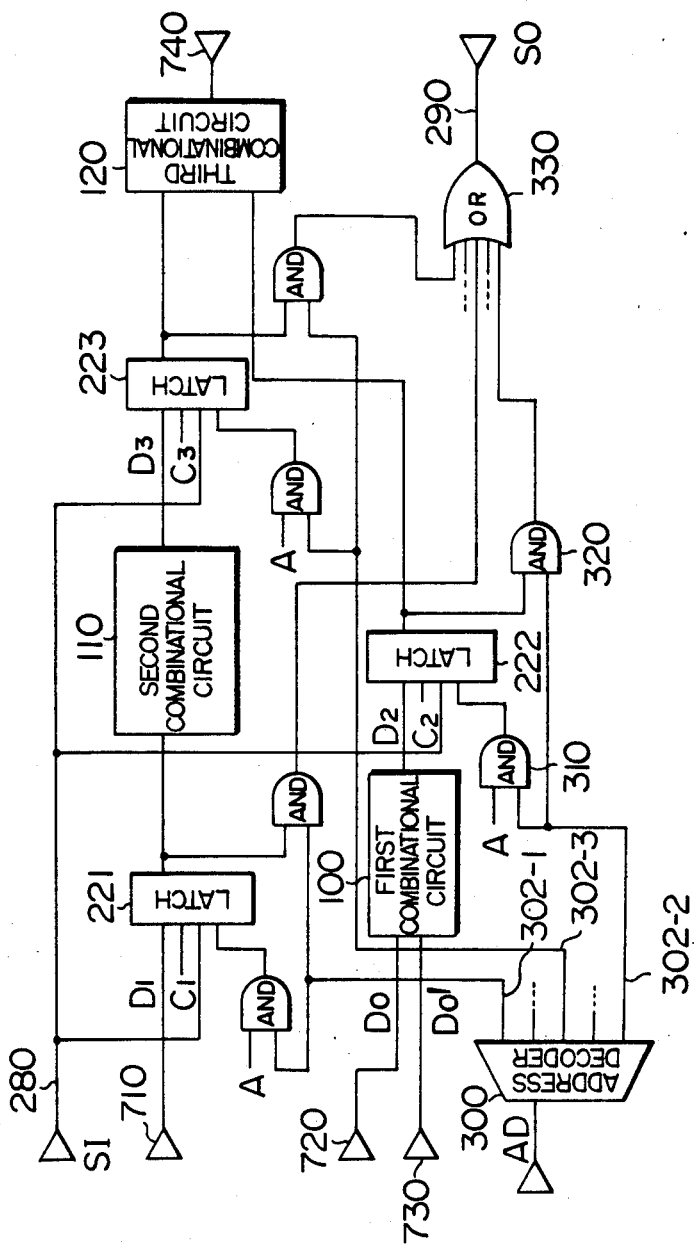
FIG. 3 is a block diagram showing another modified version of the sequential circuit of FIG. 1 which is additionally provided with a random-scan circuit.
Figure 9:
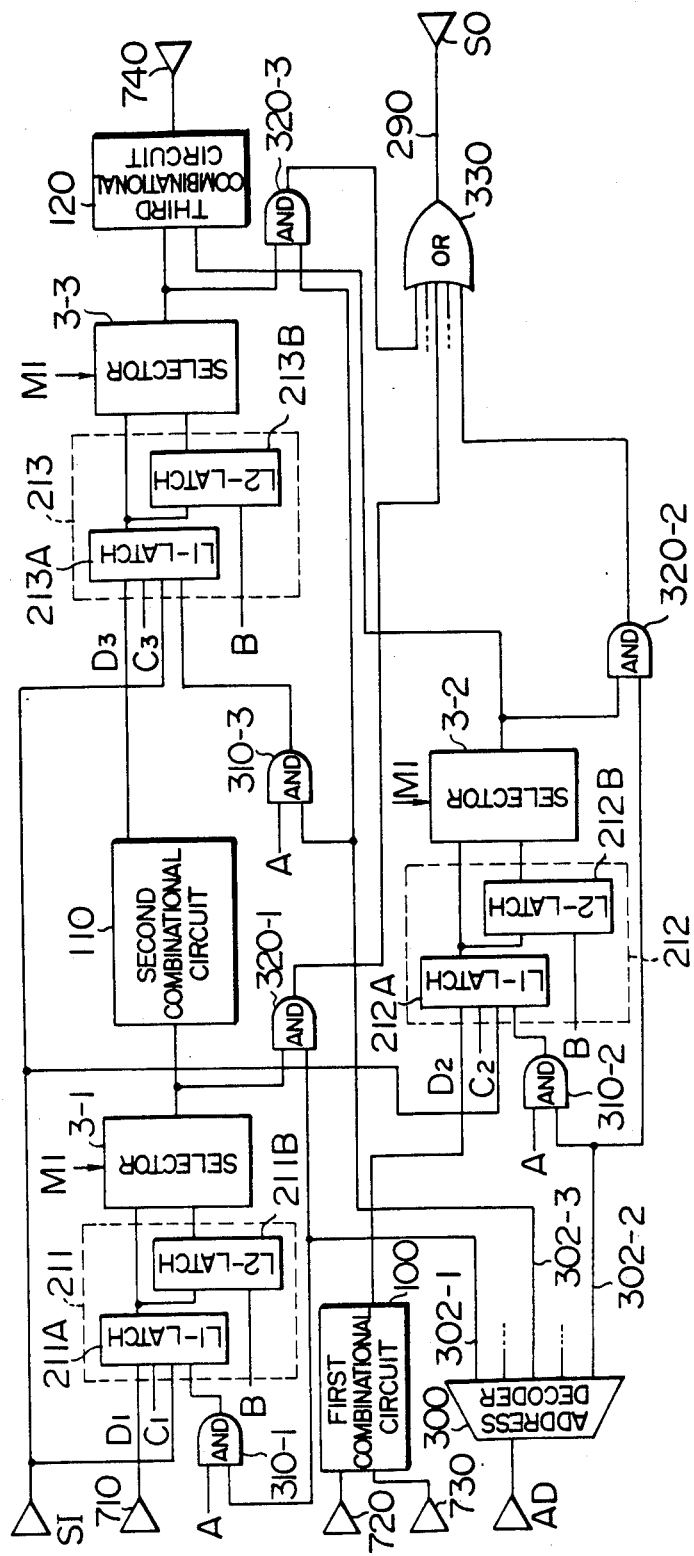
FIG. 9 is a block diagram showing another embodiment of a logic circuit according to the present invention which corresponds to the circuit of FIG. 3.

FIG. 9 shows another embodiment of a logic circuit according to the present invention, and the embodiment corresponds to the circuit of FIG. 3 having a random-scan circuit. In FIG. 9, the same reference numerals as in FIG. 3 designate like parts. In the present embodiment, the latches 211, 212 and 213 each having a master-slave arrangement and the selectors 3-1, 3-2 and 3-3 are used in place of the latches 221, 222 and 223 of FIG. 3, and the mode control signal M1 and the shift clock signal B are used in addition to the system clock signals $C_1$, $C_2$ and $C_3$ and the scan clock signal A of FIG. 3. In other words, the L1-latches (namely, the master latches) 211A, 212A and 213A correspond to the latches 221, 222 and 223, repectively, and the L2-latches (namely, the slave latches) 211B, 212B and 213B and the selectors 3-1, 3-2 and 3-3 are added to the circuit of FIG. 3, to form the present embodiment. The embodiment of FIG. 9 is different from the embodiment of FIG. 5 in that the mode control signal M1 is applied to all of the selectors 3-1, 3-2 and 3-3.

Further, in the embodiment of FIG. 9, input data from the scan-in pin SI is applied to three parallel-connected circuit parts (that is, the series combination of the L1-latch 211A, the L2-latch 211B and the selector 3-1, the series combination of the L1-latch 212A, the L2-latch 212B and the selector 3-2, and the series combination of the L1-latch 213A, the L2-latch 213B and the selector 3-3), and is sent to the scan-out pin SO through the OR gate 330. It is to be noted that both an L1-latch 211A, 212A or 213A which is to take in the input data, and an L2-latch 211B, 212B and 213B which is to deliver data, are specified in such a manner that an output 302-$i$ from the address decoder 300 is applied to AND gates 310-$i$ and 320-$i$ (where i=1, 2 or 3).

The mode control signal M1 is put to the level "1" in a regular operation, and is put to the level "0" in a diagnostic operation. Although a timing chart of the diagnostic operation is omitted, the diagnostic operation can be performed in a manner similar to that shown in FIG. 8. Hence, there arises no problem even when the system clock signals $C_1$ and $C_3$ are in phase.

Figure 10:
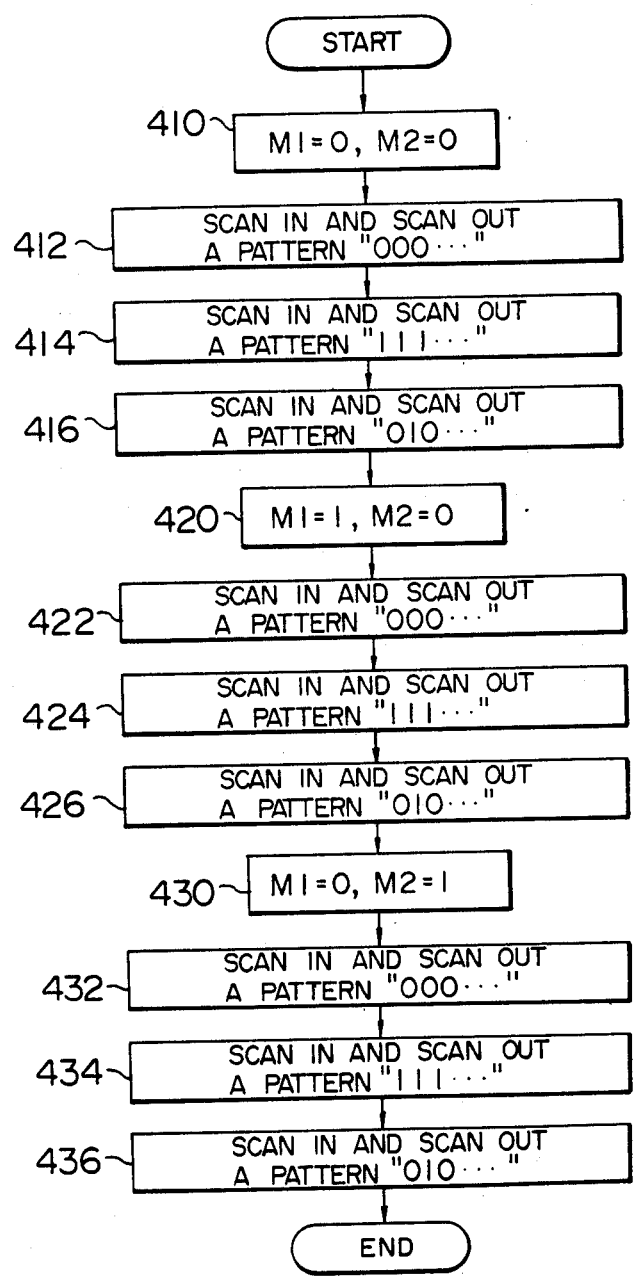
FIG. 10 is a flow chart showing the procedure in the 0-cycle test for the embodiment of FIG. 5.

FIG. 10 shows the procedure in the 0-cycle test for the embodiment of FIG. 5. Referring to FIG. 10, it is checked in steps 410, 412, 414 and 416 whether or not a shift string which connects the L1-latch 211A, the L2-latch 211B, the selector 3-1, the L1-latch 212A, and so on in this order, can operate normally in a diagnostic operation. Any fault on the above shift string can be detected in such a manner that a test pattern applied to the scan-in pin SI is shifted to the scan-out pin SO by applying the shift clock pulses A and B alternately, and the pattern appearing on the scan-out pin SO is observed. However, the above steps cannot detect a fault in the direct path between each of the L1-latches 211A, 212A and 213A and the output terminal of a corresponding one of the selectors 3-1, 3-2 and 3-3. In order to detect such a fault, it is necessary to put the mode control signals M1 and M2 to the level "1", so that the selectors 3-1, 3-2 and 3-3 select the L1-latches 211A, 212A and 213A, respectively. In this case, however, each of the latches 211, 212 and 213 does not take a master-slave arrangement, and hence a stable shifting operation is not always performed. In order to solve this problem, two combinations of the levels of the mode control signals M1 and M2 are used. In steps 420, 422, 424 and 426, the direct path between each of the L1-latches of odd-numbered latches and the output terminal of a corresponding one of selectors, for example, the direct path between the L1-latch 211A of the latch 211 and the output terminal of the selector 3-1, and the direct path between the L1-latch 213A of the latch 213 and the output terminal of the selector 3-3 are checked. While, in steps 430, 432, 434 and 436, the direct path between each of the L1-latches of even-numbered latches and the output terminal of a corresponding one of selectors, for example, the direct path between the L1-latch 212A of the latch 212 and the output terminal of the selector 3-2 is checked. For both the processing in steps 422, 424 and 426 and the processing in steps 432, 434 and 436, it is necessary to make large the width of the shift clock pulse A so that the input data in an L1-latch can reach the next L1-latch through a selector in the duration time of the shift clock pulse A. Further, it is necessary to apply the shift clock pulses A and B half less frequently in steps 422 to 426 and in steps 432 to 436 than in steps 412 to 416.

Figure 11:
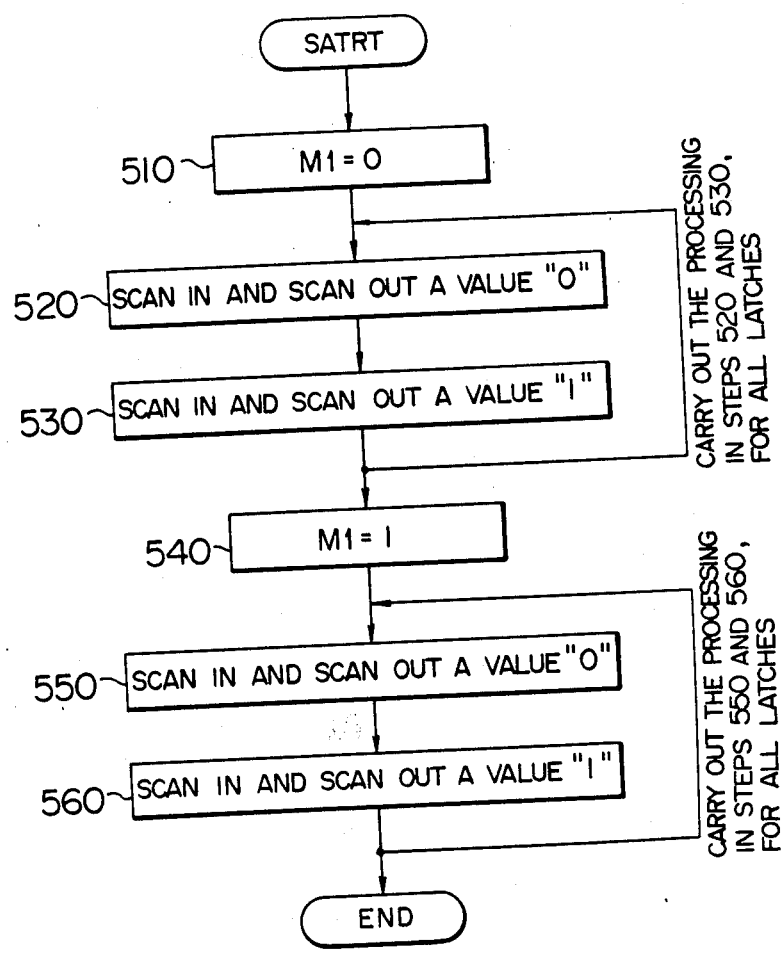
FIG. 11 is a flow chart showing the procedure in the 0-cycle test for the embodiment of FIG. 9.

FIG. 11 shows the procedure in the 0-cycle test for the embodiment of FIG. 9. In steps 510, 520 and 530, a fault in the path which connects the L1-latch 211A, 212A or 213A, the L2-latch 211B, 212B or 213B, and the selector 3-1, 3-2 or 3-3, can be detected. In this case, the address of one of the latches 211, 212 and 213 is selec-tively specified, and the shift clock signal B is applied after the scan clock signal A has been applied. In steps 540, 550 and 560, a fault in the direct path between the L1-latch 211A, 212A or 213A and the selector 3-1, 3-2 or 3-3 can be detected. In this case, only the scan clock signal A is applied.

As has been explained in the foregoing, according to the present invention, restrictions on the logical design of a logic circuit such as the prohibition of data transfer between latches having the same phase and the absence of one-latch loop, can be eliminated without considerably increasing the system delay in the regular operation of the logic circuit, and a stable diagnostic opera-tion can be performed for a logic circuit in which a one-latch loop exists and data is transferred between latches having the same phase.

We Claim:

1. A logic current having a diagnostic function, comprising:
 a plurality of combinational circuits;
 a plurality of first latch circuits each connected to an output terminal of one of said combinational circuits for taking in output data of said one combinational circuit in response to an applied one of a plurality of system clock signals and for taking in test data applied to each first latch circuit in response to an applied first scan clock signal;
 a plurality of second latch circuits each connected to an output terminal of a corresponding one of said first latch circuits and responsive to an applied second scan clock signal for taking in output data of the corresponding first latch circuit; and
 a plurality of selectors each having an output terminal connected to an input terminal of a corresponding one of said combinational circuits, and having two input terminals respectively connected to the output terminal of one of said first latch circuits and to an output terminal of one of said second latch circuits connected to said one first latch circuit and reponsive to an applied at least one mode control signal for selectively outputting an output signal of the one first latch circuit or an output signal of the one second latch circuit, respectively.

2. A logic circuit having a diagnostic function as claimed in claim 1, wherein the output terminal of one of said selectors is further connected to a test data receiving terminal of one of said first latch circuits connected to one of said combinational circuit, said first latch circuit and said second latch circuits functioning as a shift register between a common test data input terminal and a common test data output terminal both provided for the logic circuit to transfer therethrough test data from the common test data input terminal to a selected one of said first latch circuits or to transfer output data of one of the combinational circuits to the common test data output terminal.

3. A logic circuit having a diagnostic function as claimed in claim 1, wherein said first latch circuits are coupled to a common test data input terminal provided for the logic circuit, and wherein said logic circuit further comprises gate means responsive to an applied address signal for applying said first scan clock signal selectively to one of said first latch circuits and for selectively connecting the output of a selector which is connected to one of the first latch circuits through a corresponding second latch circuit, to a common test data output terminal provided for the logic circuit.

4. A logic circuit having a diagnostic function as claimed in claim 1, wherein, by applying one of said system clock signals and the mode control signal having a first value respectively to said first latch circuits and one of said selectors in a normal mode operation, an output of one of said combinational circuits can be transferred to another one of said combinational circuits via one of the first latch circuits and one of the selectors; and wherein, by applying said first and second scan clock signals respectively to a selected first latch circuit and a selected second latch circuit connected thereto and test data to said selected first latch circuit during a test mode of operation, the test data can be transferred via the selected first and second latch circuits and the selector connected thereto to one of said combinational circuits, and, by applying one of the system clock signals and the second scan clock signal respectively to said selected first and second latch circuits and the mode control signal having a second value to the selector connected to the selected first and second latch circuits, during a test mode of operation, output data of one of said combinational circuits is outputted by the selector by way of the selected first and second latch circuits.

* * * * *